United States Patent
Cheng

(10) Patent No.: US 12,136,675 B2
(45) Date of Patent: Nov. 5, 2024

(54) ENHANCEMENT-MODE DEVICE AND PREPARATION METHOD THEREFOR

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 467 days.

(21) Appl. No.: 17/410,087

(22) Filed: Aug. 24, 2021

(65) Prior Publication Data

US 2021/0384360 A1 Dec. 9, 2021

Related U.S. Application Data

(63) Continuation of application No. PCT/CN2020/086135, filed on Apr. 22, 2020.

(30) Foreign Application Priority Data

Apr. 26, 2019 (CN) .......................... 201910336804.1
Apr. 26, 2019 (CN) .......................... 201920590552.0

(51) Int. Cl.
*H01L 29/788* (2006.01)
*H01L 29/66* (2006.01)

(52) U.S. Cl.
CPC .... *H01L 29/7883* (2013.01); *H01L 29/66462* (2013.01)

(58) Field of Classification Search
CPC .................. H01L 29/7883; H01L 29/66462
See application file for complete search history.

(56) References Cited

U.S. PATENT DOCUMENTS

| 9,799,726 B1 | 10/2017 | Khalil |
| 9,818,855 B2 * | 11/2017 | Saito ................ H01L 21/02266 |
| 11,133,399 B2 * | 9/2021 | Yoshimochi .... H01L 21/823481 |
| 2006/0220060 A1 * | 10/2006 | Nakata .............. H01L 29/42316 |
| | | 257/E29.127 |
| 2009/0315037 A1 * | 12/2009 | Kikkawa ............. H01L 29/7783 |
| | | 438/192 |

(Continued)

FOREIGN PATENT DOCUMENTS

| CN | 102332469 A | 1/2012 |
| CN | 105470294 A | 4/2016 |

(Continued)

OTHER PUBLICATIONS

Chowdhury, Srabanti GaN-on GaN Power Device Design and Fabrication, 2019, Relevant sections: 6.11.1, 6.12, Fig 6.17 (Year: 2019).*

(Continued)

*Primary Examiner* — Chad M Dicke
*Assistant Examiner* — Jeremy Daniel Watts
(74) *Attorney, Agent, or Firm* — Westbridge IP LLC

(57) ABSTRACT

Disclosed are an enhancement-mode device and a preparation method therefor. The enhancement-mode device adopts a vertical or semi-vertical structure, and a nitride heterojunction with a non-polar surface or semi-polar face is prepared, such that two-dimensional electron gas is interrupted at the position, and the enhancement-mode device is obtained.

20 Claims, 14 Drawing Sheets

(56) References Cited

U.S. PATENT DOCUMENTS

| | | | | |
|---|---|---|---|---|
| 2009/0321854 | A1* | 12/2009 | Ohta | H01L 29/66462 257/411 |
| 2010/0025730 | A1* | 2/2010 | Heikman | H01L 29/402 257/E21.403 |
| 2013/0099286 | A1* | 4/2013 | Imada | H01L 29/66431 257/192 |
| 2013/0181255 | A1* | 7/2013 | Kiyama | H01L 29/155 257/190 |
| 2016/0225857 | A1* | 8/2016 | Saito | H01L 21/0228 |
| 2020/0119179 | A1* | 4/2020 | Mishra | H01L 29/0692 |
| 2021/0399125 | A1* | 12/2021 | Huang | H01L 29/66462 |

FOREIGN PATENT DOCUMENTS

| | | |
|---|---|---|
| CN | 102822950 B | 6/2016 |
| CN | 105679823 A | 6/2016 |
| CN | 107431085 A | 12/2017 |
| CN | 209675293 U | 11/2019 |

OTHER PUBLICATIONS

Chowdhury, Srabanti. Electrical and Computer Engineering, UC Davis, Davis, California, United States (Year: 2019).*

International Search Report issued in corresponding PCT Application No. PCT/CN2020/086135, dated Jul. 22, 2020.

Written Opinion issued in corresponding PCT Application No. PCT/CN2020/086135, dated Jul. 22, 2020.

* cited by examiner

ENHANCEMENT-MODE DEVICE AND PREPARATION METHOD THEREFOR

CROSS-REFERENCE TO RELATED APPLICATIONS

This application is a continuation of International Application No. PCT/CN2020/086135, filed on Apr. 22, 2020, which claims priority to Chinese Patent Application No. 201920590552.0, filed on Apr. 26, 2019, and Chinese Patent Application No. 201910336804.1, filed on Apr. 26, 2019. All of the aforementioned patent applications are hereby incorporated by reference in their entireties.

TECHNICAL FIELD

The disclosure relates to a field of microelectronics technologies, in particular to an enhancement-mode device and a preparation method therefor.

BACKGROUND

In an application of a radio-frequency/microwave power amplifier or power switching device, due to gallium nitride material has characteristics of large band gap, high electron saturation drift speed, high breakdown field strength, and good thermal conductivity, high electron mobility transistor (HEMT) based on gallium nitride material has obvious advantages in applications in high temperature, high frequency, high voltage or high-power compared with a device based on silicon and gallium arsenide.

Generally, two-dimensional electron gas in an AlGaN/GaN heterojunction is used as a conductive channel in an HEMT based on gallium nitride material. Due to spontaneous polarization and piezoelectric polarization effects in an AlGaN and GaN material, a two-dimensional electron gas is in a conductive state under zero bias. A device corresponding to this kind of two-dimensional electron gas is a depletion-type device. However, in an off state, a negative voltage to bias the gate must be used for a depletion-type (normally open) device, which increases a complexity and cost of a system circuit. An enhancement-mode (normally off) device is in an off state when power is off, which eliminates a need of a negative voltage bias power supply, as well as improves the safety of a system. Therefore, an enhancement-mode device is more practical. In order to realize a GaN-based enhancement-mode HEMT device, a special design of material and device structure (especially a gate region) is required to reduce a concentration of the two-dimensional electron gas in the gate region when a voltage of gate is zero.

There are already several common solutions to realize a GaN-based enhancement-mode device. In a solution corresponding to FIG. 1, an aluminum gallium nitride layer under a gate is partially thinned. As shown in FIG. 1, a buffer layer 1, a gallium nitride channel layer 2, and an aluminum gallium nitride barrier layer 3 are stacked on the substrate 10 respectively. A gate 4, a source 5, and a drain 6 are located on the aluminum gallium nitride layer 3 respectively. A region of the aluminum gallium nitride layer under the gate 4 is partially corroded, thereby reducing a thickness of the aluminum gallium nitride layer in the gate region. However, in order to obtain a better depletion effect, the thickness of the aluminum gallium nitride layer must generally be reduced to less than 3 nm to 5 nm, which places a high requirement on an accuracy of etching. Another solution is to implant fluorine ions into an epitaxial layer under the gate. Because the fluoride ions carry negative charges, a conduction band will be pulled up after the implantation and a two-dimensional electron gas under the gate will be depleted to form a structure of an enhancement-mode device. A corresponding structure of the device is shown in FIG. 2, wherein an aluminum gallium nitride layer 7 under a gate 4 is a fluorine ion implanted region. However, a lattice of nitride material will be damaged after the implantation of fluorine ions. A lattice defect scattering will reduce a mobility of a channel carrier and saturated operating current, so as to restrict an operating performance of a device.

Therefore, in view of the above technical problems, it is necessary to provide an enhancement-mode device and a preparation method therefor.

SUMMARY

An enhancement-mode device, prepared based on the principle of the nitride polarization effect, has more reliable performance due to less process damage. A vertical structure device can further improve an ability of the device to withstand high current. A purpose of the present invention is to provide an enhancement-mode device and a preparation method therefor. The device includes a vertical structure and a semi-vertical structure. A trench is formed in a gate region to obtain a non-polar or semi-polar surface of nitride. Two-dimensional electron gas at a heterojunction is interrupted in this surface so as to achieve an enhancement-mode characteristic. To realize the foregoing objective, embodiments of the disclosure provide a following technical solution:

An enhancement-mode device with a multilayer epitaxial structure, including:
a heavily doped n-type nitride layer;
a lightly doped n-type nitride layer disposed on the heavily doped n-type nitride layer;
an insulating layer disposed on the lightly doped n-type nitride layer, and a trench being provided in the insulating layer;
a nitride channel layer disposed on a surface and sidewalls of the insulating layer;
a nitride barrier layer disposed on a surface and sidewalls of the nitride channel layer;
a gate structure disposed between the sidewalls of the nitride barrier layer;
a source electrode disposed on the surface of the nitride barrier layer; and
a drain electrode disposed in contact with the heavily doped n-type nitride layer.

Further, the gate structure includes a gate electrode.
As a further improvement of the invention, wherein the gate structure includes a p-type semiconductor and a gate electrode formed on the p-type semiconductor.

As a further improvement of the invention, wherein the gate structure includes a gate electrode and a dielectric layer, and the dielectric layer is disposed between the gate electrode and the nitride barrier layer, and between the gate electrode and the lightly doped n-type nitride layer.

As a further improvement of the invention, wherein the gate structure exceeds the sidewall of the nitride barrier layer and extends to the upper surface of the nitride barrier layer to form a T-shaped structure.

As a further improvement of the invention, wherein the gate structure is covered by a dielectric layer, and a surface of the dielectric layer is covered by the source electrode, so as to form a buried gate electrode.

As a further improvement of the invention, wherein the dielectric layer is made up of any one or a combination of SiN, SiCN, SiO$_2$, SiAlN, Al$_2$O$_3$, AlON, SiON, HfO$_2$.

As a further improvement of the invention, wherein the insulating layer includes a semi-insulating layer, and the semi-insulating layer includes one or more of an unintentionally doped nitride layer, a carbon doped nitride layer, an ion doped nitride layer, and a magnesium doped nitride layer.

As a further improvement of the invention, wherein the heavily doped n-type nitride layer, the lightly doped n-type nitride layer, the insulating layer, the nitride channel layer, and the nitride barrier layer are one or a combination of a gallium nitride layer, an indium gallium nitrogen layer, an aluminum-gallium nitrogen layer, an aluminum-indium nitrogen layer and an aluminum-indium gallium nitrogen layer.

As a further improvement of the invention, wherein the multilayer epitaxial structure further includes a nitride cap layer formed on the nitride barrier layer, and the nitride cap layer is a gallium nitride layer or an aluminum gallium nitride layer.

As a further improvement of the invention, wherein an aluminum nitride layer is disposed between the nitride channel layer and the nitride channel layer.

As a further improvement of the invention, wherein a cross-section shape of the trench in the insulating layer is one or a combination of U-shape, V-shape, rectangle, triangle, trapezoid, polygon, and semicircle.

Accordingly, a method of preparing an enhancement-mode device includes:

S1, forming a lightly doped n-type nitride layer on a heavily doped n-type nitride layer.

S2, forming an insulating layer on the lightly doped n-type nitride layer, and a trench being provided in the insulating layer.

S3, forming a nitride channel layer on a surface and sidewall of the insulating layer, and forming a nitride barrier layer on a surface and sidewall of the nitride channel layer, wherein the nitride channel layer and the nitride barrier layer have a non-polar surface or a semi-polar surface, and at least part of the two-dimensional electron gas is interrupted.

S4, forming a gate structure between sidewalls of the nitride barrier layer.

S5, forming a source electrode on a surface of the nitride barrier layer.

S6, forming a drain electrode contacted with the heavily doped n-type nitride layer.

Further, the gate structure includes a gate electrode.

As a further improvement of the invention, wherein the gate structure includes a p-type semiconductor and a gate electrode formed on the p-type semiconductor.

As a further improvement of the invention, wherein the gate structure includes a gate electrode and a dielectric layer, and the dielectric layer is disposed between the gate electrode and the nitride barrier layer, and between the gate electrode and the lightly doped n-type nitride layer.

As a further improvement of the invention, wherein the dielectric layer is made up of any one or a combination of SiN, SiCN, SiO$_2$, SiAlN, Al$_2$O$_3$, AlON, SiON, HfO$_2$.

As a further improvement of the invention, wherein the heavily doped n-type nitride layer is a substrate.

As a further improvement of the invention, before the step S1, the method further includes providing a substrate, and growing the heavily doped n-type nitride layer on the substrate.

Before the step S6, the method further including etching or peeling the substrate until the heavily doped n-type nitride layer is exposed, forming a drain electrode on a back of the heavily doped n-type nitride layer.

As a further improvement of the invention, before step S6, the method further including etching the nitride barrier layer from a side of the nitride barrier layer away from the heavily doped n-type nitride layer until the heavily doped n-type nitride layer is exposed, and forming a drain electrode on a front surface of the heavily doped n-type nitride layer.

As a further improvement of the invention, wherein the substrate is one or a combination of sapphire, diamond, silicon carbide, silicon, lithium niobate, insulating substrate silicon, gallium nitride, and aluminum nitride.

As a further improvement of the invention, wherein the step S4 further includes:

forming a nitride cap layer on the nitride barrier layer, wherein the nitride cap layer is a gallium nitride layer or an aluminum gallium nitride layer.

As a further improvement of the invention, wherein the step S4 further includes:

forming an aluminum nitride layer between the nitride channel layer and the nitride channel layer.

Compared with existing enhancement-mode device technology, beneficial effects of this invention are described as below:

In present invention, two-dimensional electronic gas is interrupted in a place where a nitride heterojunction is prepared with a non-polar surface or a semi-polar surface, so that an enhancement-mode device is obtained. Compared with the method of etching the nitride barrier layer or implanting the gate region with fluoride ion, the present invention can avoid a performance degradation of the device caused by the damage of a source region, such as the current density reduction effect. Present invention is also easier to realize in process.

In present invention, a vertical structure device is achieved through well ohmic contact, formed by a connection between a drain electron located on a back side and a heavily doped n-type nitride layer. A semi-vertical structure device is achieved through well ohmic contact, formed by a connection between the drain electron located on the front side and the heavily doped n-type nitride layer. A lightly doped n-type nitride layer has functions of conducting electricity and withstanding voltage. A heterojunction, composed of a nitride channel layer and a nitride barrier layer, with two-dimensional electron gas, is working as a conductive channel. Part of the conductive channel is interrupted due to non-polarity or semi-polarity, and a gate mainly controls this part of the conductive channel to be on or off. An insulating layer is used to insulate the heterojunction from the lightly doped n-type nitride layer. Only the heterojunction, exposed in the gate region, with non-polar surface or semi-polar surface, is used as a conductive channel. A dielectric layer is prepared between the gate electrode and the nitride barrier layer as well as between the gate electrode and the lightly doped n-type nitride layer, so that leakage current of the gate will be reduced. If a surface of the gate is covered by the dielectric layer, a source electrode, located in the nitride barrier layer, will also cover the gate region, so as to realize the simplification of a pattern of the source electrode. An enhancement-mode device made of nitride material is realized by this structural design. The device has advantages of smaller on-resistance, higher current-carrying capacity, and higher chip area utilization rate.

BRIEF DESCRIPTION OF DRAWINGS

To illustrate technical solution of the invention more clearly, the following will briefly introduce drawings needed to be used in the description of the embodiments or the prior art. Obviously, the drawings in the following description are only some embodiments recorded in the present invention, for those of ordinary skill in the art, other drawings can be obtained based on these drawings without creative work.

DESCRIPTION OF EMBODIMENTS

Figure 1:
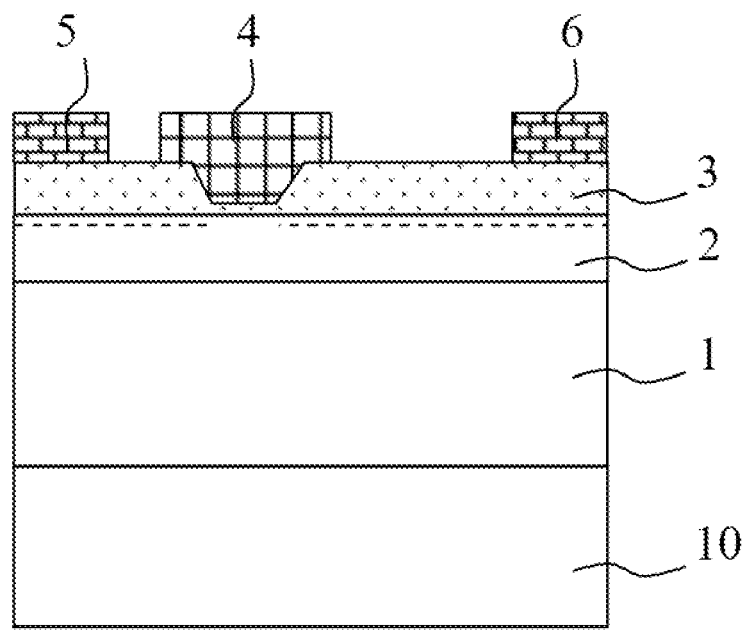
FIG. 1 is a schematic diagram of the structure of an enhancement-mode device in which a thickness of an aluminum gallium nitrogen layer is partially thinned in a gate in the prior art.
Figure 2:
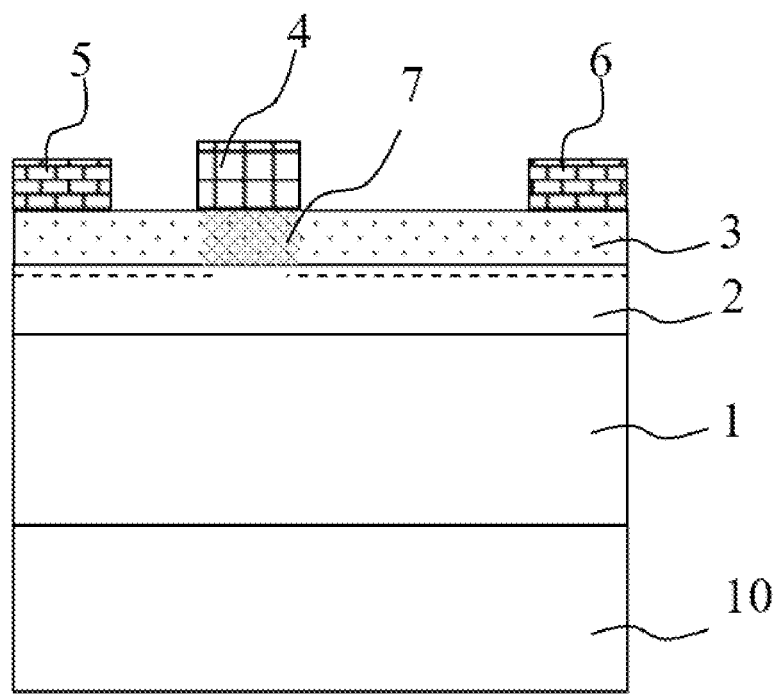
FIG. 2 is a schematic diagram of the structure of an enhancement-mode device in which fluorine ions are implanted under a gate in the prior art.

Hereinafter, the present invention will be described in detail with reference to the specific embodiments shown in the drawings. However, these embodiments shall not limit the present invention, and the structural, method, or functional changes made by those skilled in the art based on these embodiments are all included in the protection scope of the present invention.

In addition, repeated reference numbers or labels may be used in different embodiments. These repetitions are just for the simple and clear description of the present invention, and do not represent any correlation between the different embodiments and/or structures discussed.

The technical scheme of the present invention will be described in detail below in conjunction with the drawings and through specific implementations.

Figure 3A:
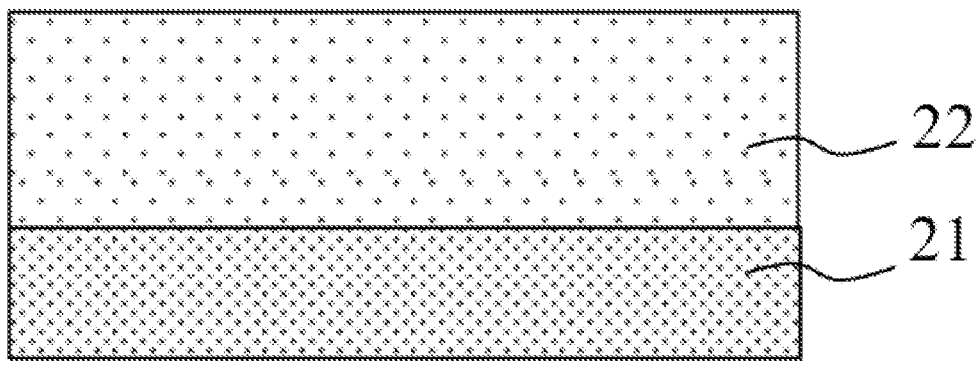
FIGS. 3A, 3B, 4, 5, 6A-6D, 7A-7H and 8A-8I are state diagrams of preparation method of an enhancement-mode device of the present invention.

This application provides a method for preparing an enhancement-mode device, the specific steps are:

S1, as shown in FIG. 3A, epitaxial growth a lightly doped n-type nitride layer 22 on a heavily doped n-type nitride layer 21.

In this embodiment, the heavily doped n-type nitride layer 21 means that the concentration of doped n-type impurities in the nitride layer is greater than or equal to $5E17\ cm^{-3}$, the lightly doped n-type nitride layer means that the concentration of doped n-type impurities in the nitride layer is less than or equal to $5E16\ cm^{-3}$.

Figure 3B:
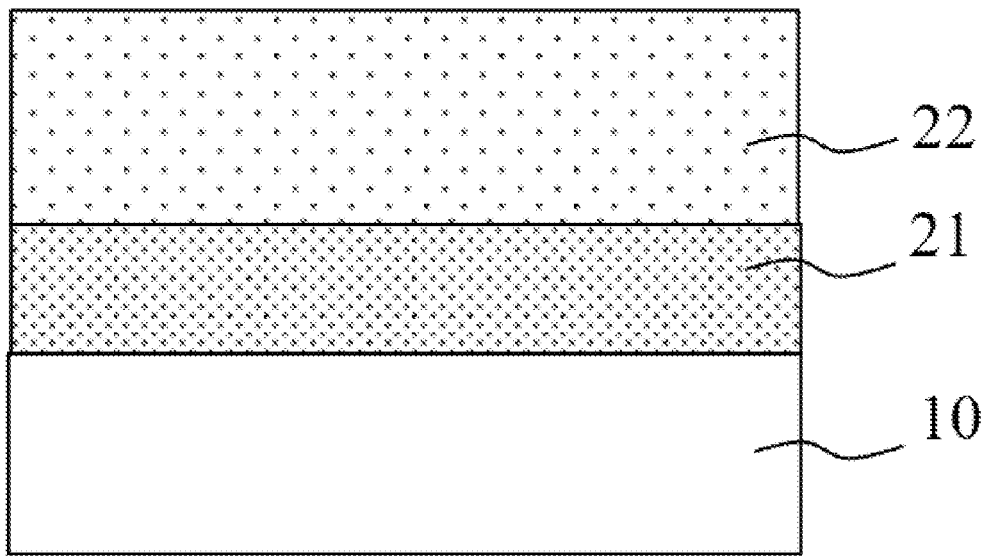

In this embodiment, the heavily doped n-type nitride layer 21 is directly served as a substrate. Directly epitaxial growth the lightly doped n-type nitride layer 22 on the heavily dope n-type nitride layer 21. In another embodiments, as shown in FIG. 3B, a heavily doped n-type nitride layer 21 may be grew on a substrate 10. And then etching or peeling the substrate until the heavily doped n-type nitride layer is exposed. The substrate 10 is sapphire, diamond, silicon carbide, silicon, lithium niobate, insulating substrate silicon, gallium nitride, aluminum nitride and so on.

Figure 4:
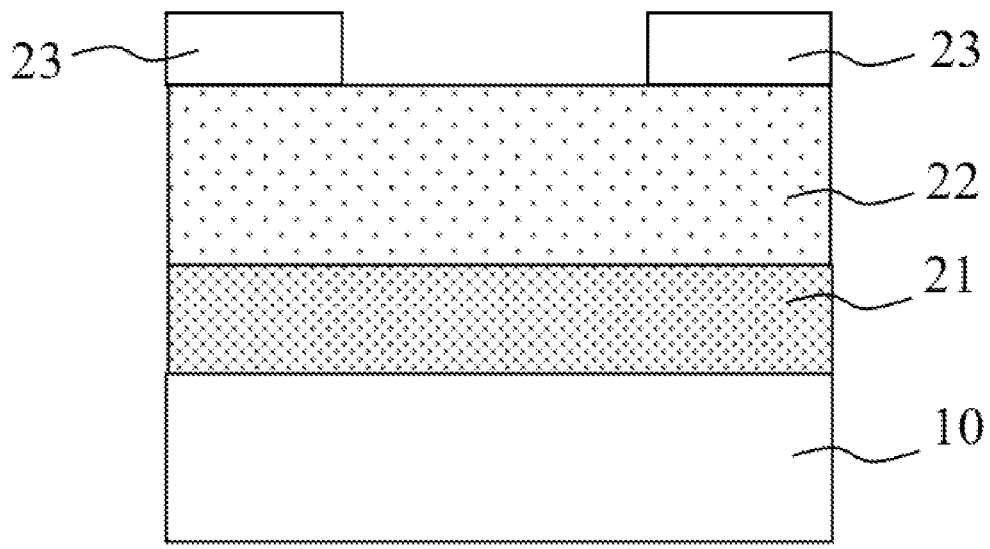

S2, as shown in FIG. 4, forming an insulating layer 23 on the lightly doped n-type nitride layer 22, and a trench being provided in the insulating layer.

In this embodiment, the trench may be formed by selectively epitaxial growth the insulating layer 23 on the lightly doped n-type nitride layer 22, so that a rectangular trench between the insulating layer 23 is formed. The trench may also be formed by firstly epitaxial growth the insulating layer 23 on the lightly doped n-type nitride layer 22, and then etching the insulating layer 23. Specifically, etching the trench from a side of the insulating layer 23 far away from the lightly doped n-type nitride layer 22, and stop etching when meeting the lightly doped n-type nitride layer 22. The trench between the insulating layer 23 will be formed thereafter. This case does not impose specific restrictions on the formation method of the trench.

Further, a cross-section shape of the trench is one or a combination of U-shape, V-shape, rectangle, triangle, trapezoid, polygon, and semicircle.

Figure 5:
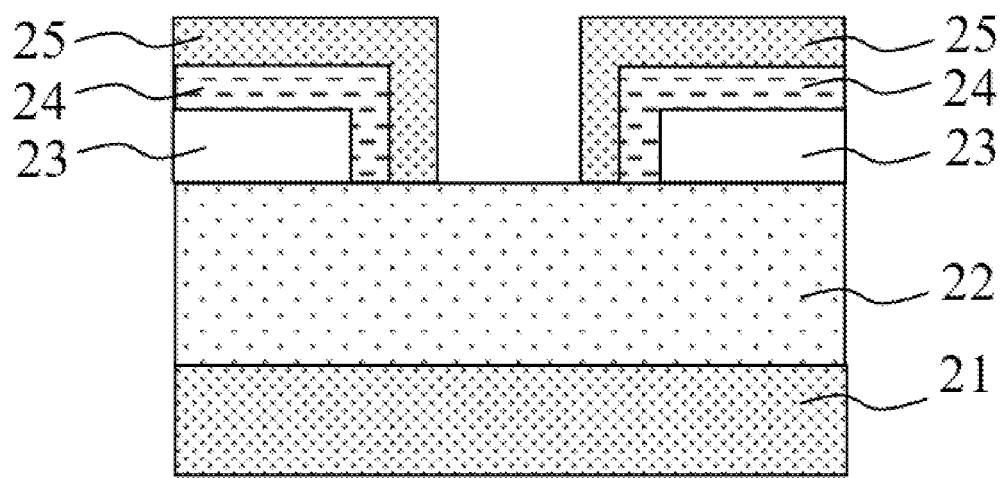

S3, as shown in FIG. 5, forming a nitride channel layer 24 on a surface and sidewall of the insulating layer 23, and forming a nitride barrier layer 25 on a surface and sidewall of the nitride channel layer 24, wherein the nitride channel layer 24 and the nitride barrier layer 25 have a non-polar surface or a semi-polar surface, and at least part of the two-dimensional electron gas is interrupted.

It will be understood that a method to form the nitride channel layer 24 and the nitride barrier layer 25 may be selective epitaxial growth method. The nitride channel layer 24 is only formed on the surface and sidewall of the insulating layer 23, and the nitride barrier layer 25 is only formed on the surface and sidewall of the nitride channel layer 24. The forming method may also be forming the nitride channel layer 24 on the insulating layer 23 and in the trench. Then etching the nitride channel layer 24 located in the trench. And then forming the nitride barrier layer 25 on the nitride channel layer 24 and in the trench. And then etching the nitride barrier layer 25 located in the trench. It should be guaranteed that the trench will not be covered by the nitride channel layer 24 and by the nitride barrier layer 25. A structure shown in FIG. 5 will be formed through the above-mentioned steps. A non-polar or semi-polar direction which is inconsistent with a direction of a polar plane of the nitride crystal is formed on the sidewall of the trench, so that a two-dimensional electron gas in a nitride heterojunction with the crystal direction is interrupted and an enhancement-mode device is achieved.

S4, as shown in FIGS. 6A-6D, forming a gate structure between sidewalls of the nitride barrier layer.

Figure 6A:
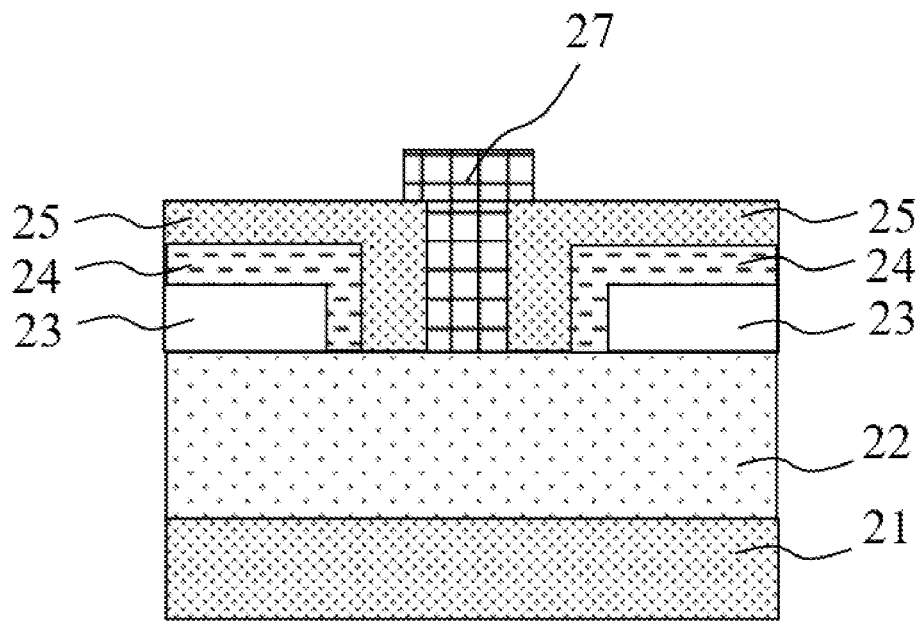

The gate structure may only include a gate electrode 27, as shown in FIG. 6A.

Figure 6B:
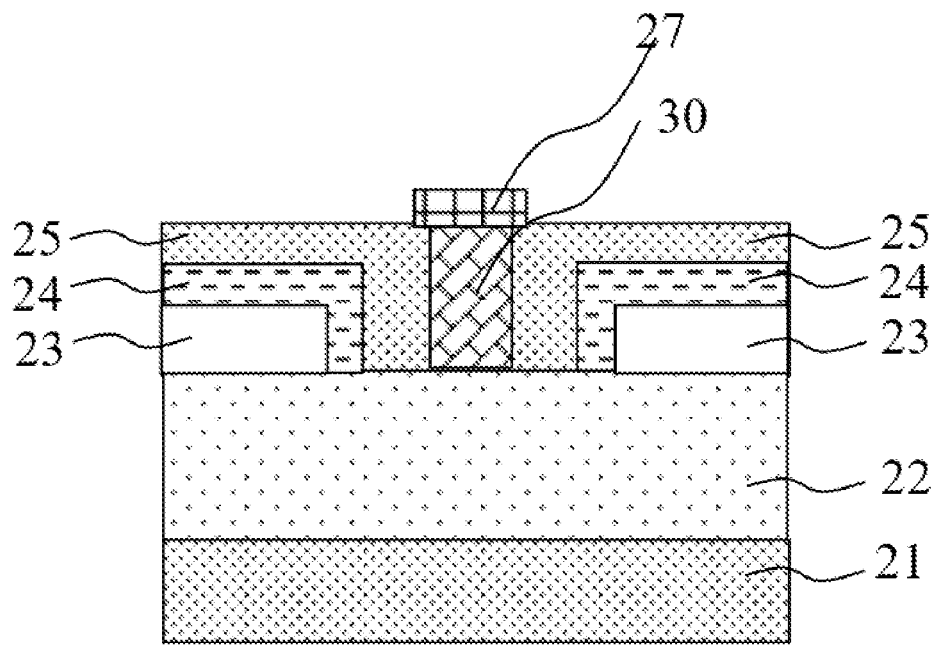

The gate structure may include a gate electrode 27 and a p-type semiconductor 30, as shown in FIG. 6B. The p-type semiconductor 30 covers the region between a sidewall of the nitride barrier layer 25, and the gate electrode 27 is formed on the p-type semiconductor 30. Wherein, the material of the p-type semiconductor includes p-type GaN base material to form a p-GaN gate structure. The GaN base material is a compound includes at least Ga atom and N atom, such as GaN, AlGaN, InGaN, AlInGaN etc.

Figure 6C:
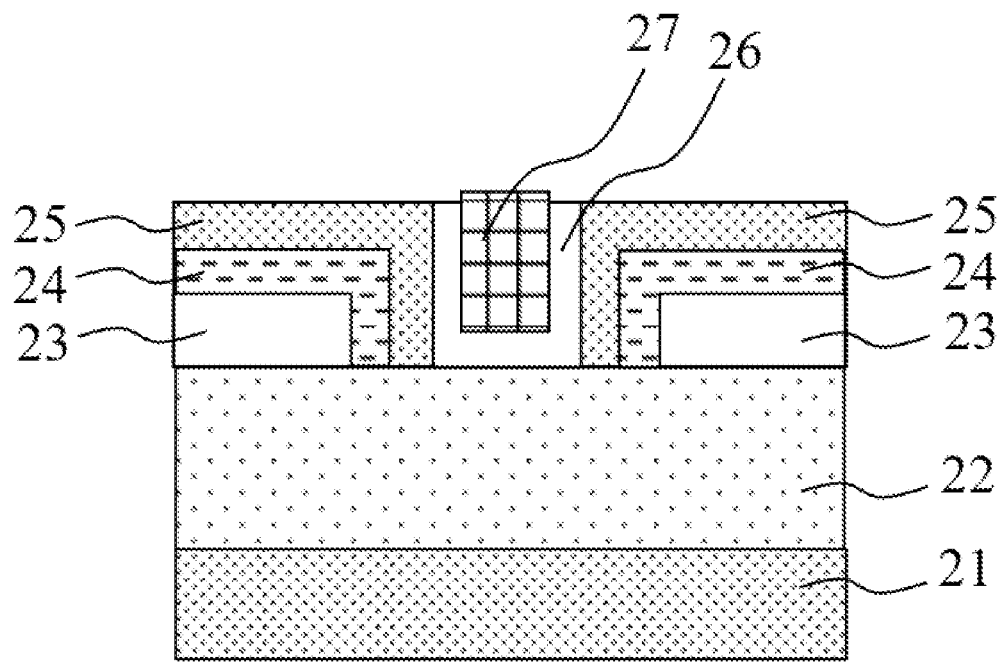
Figure 6D:
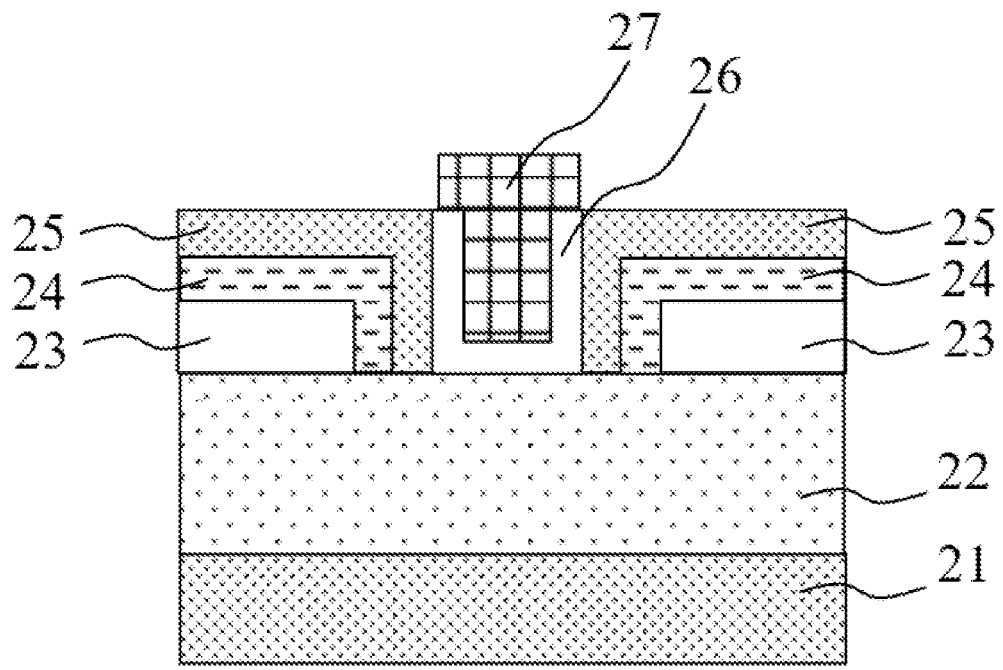
Figure 7A:
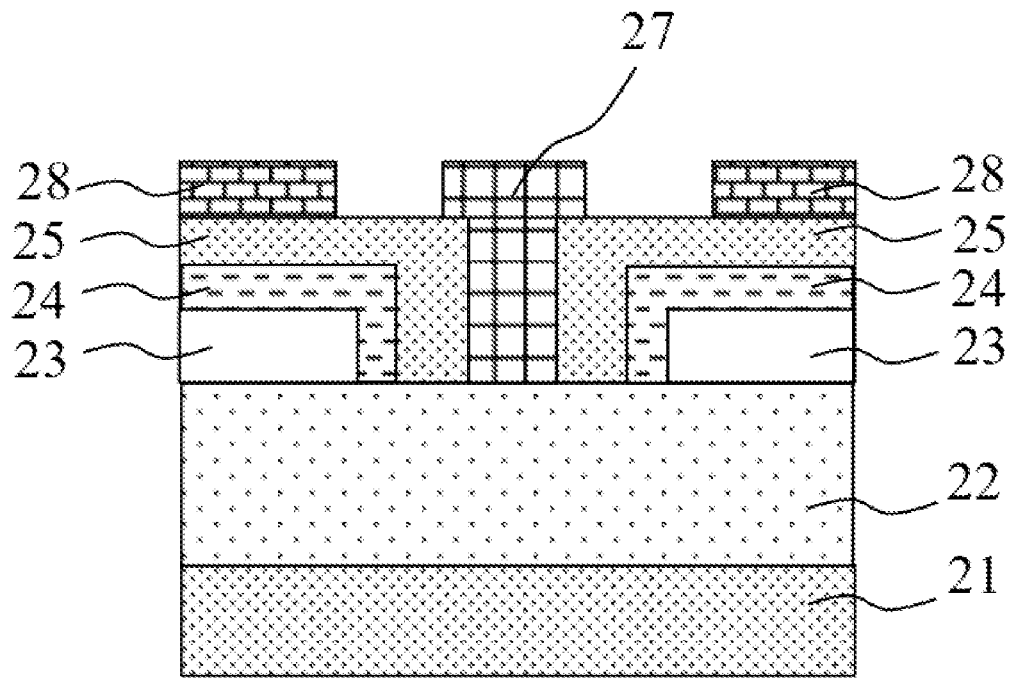
Figure 7B:
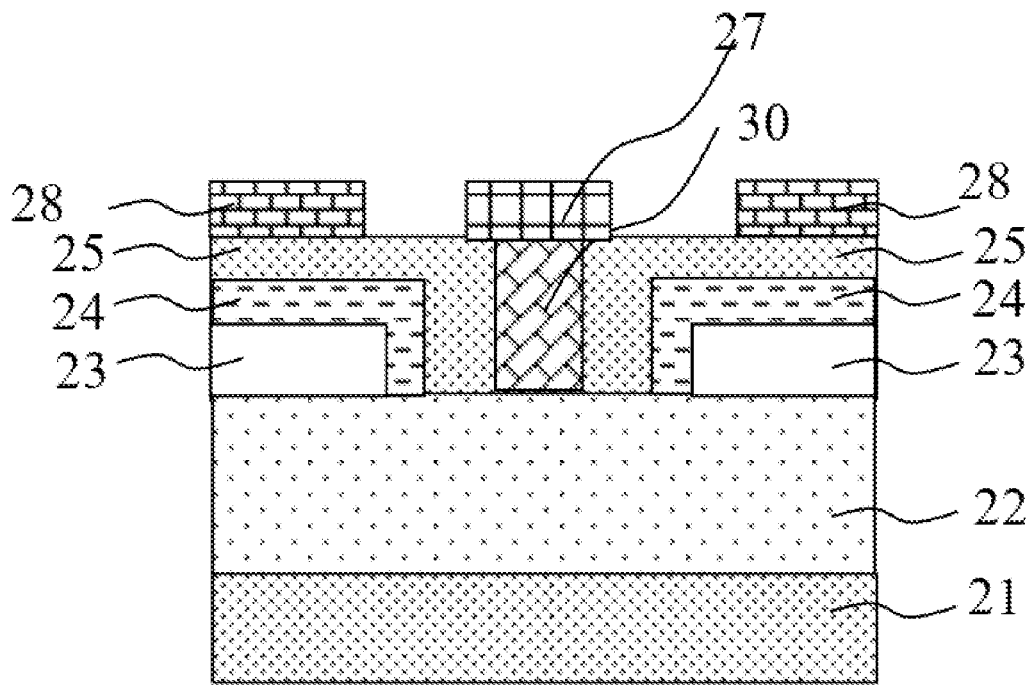
Figure 7C:
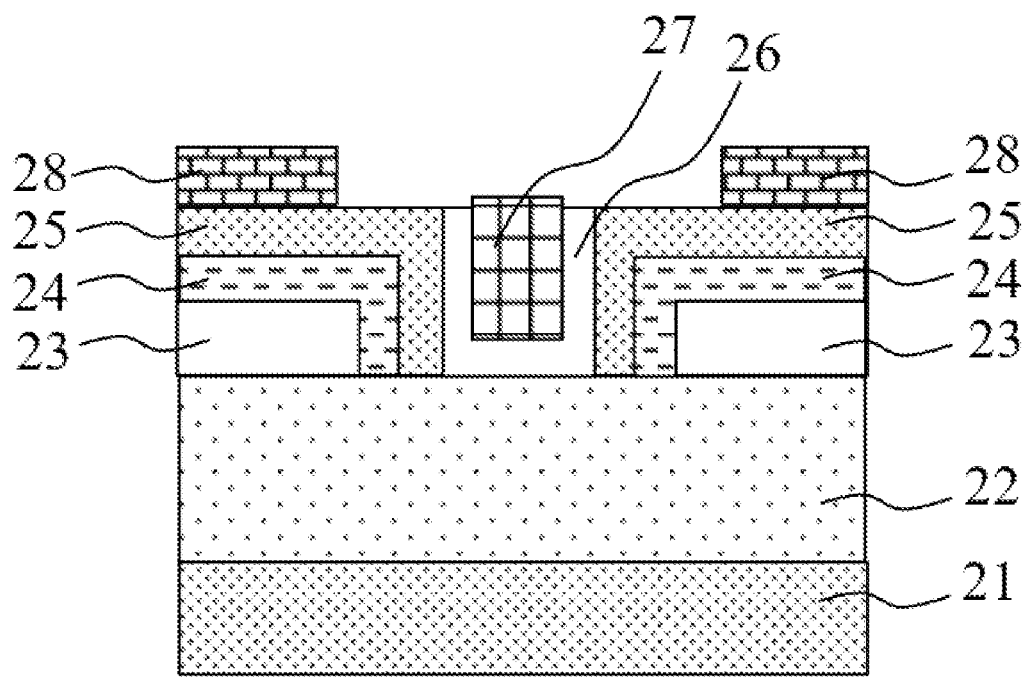
Figure 7D:
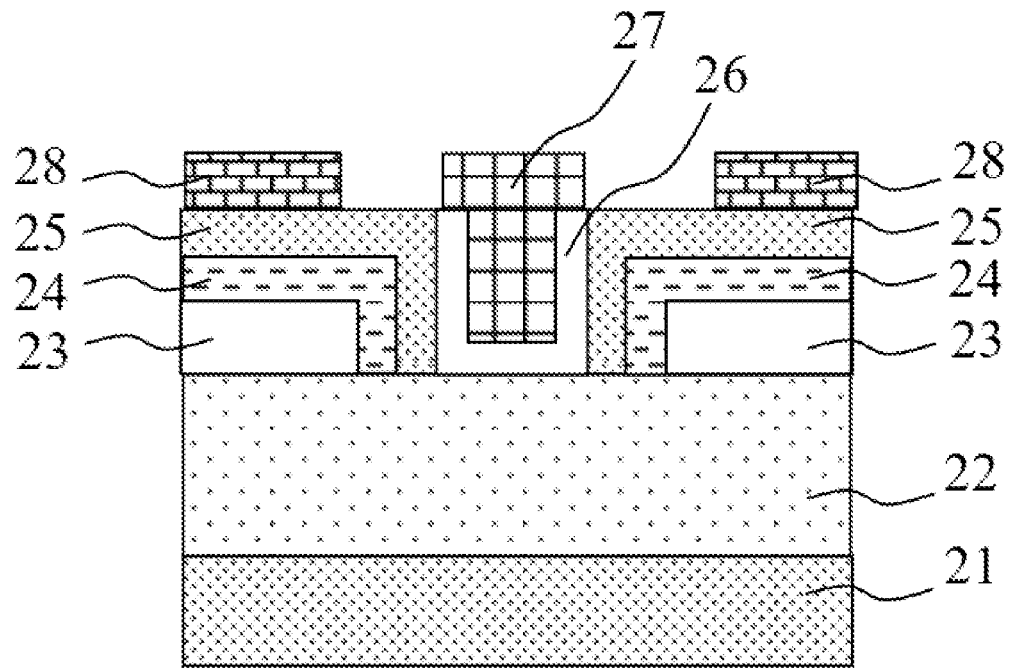
Figure 7E:
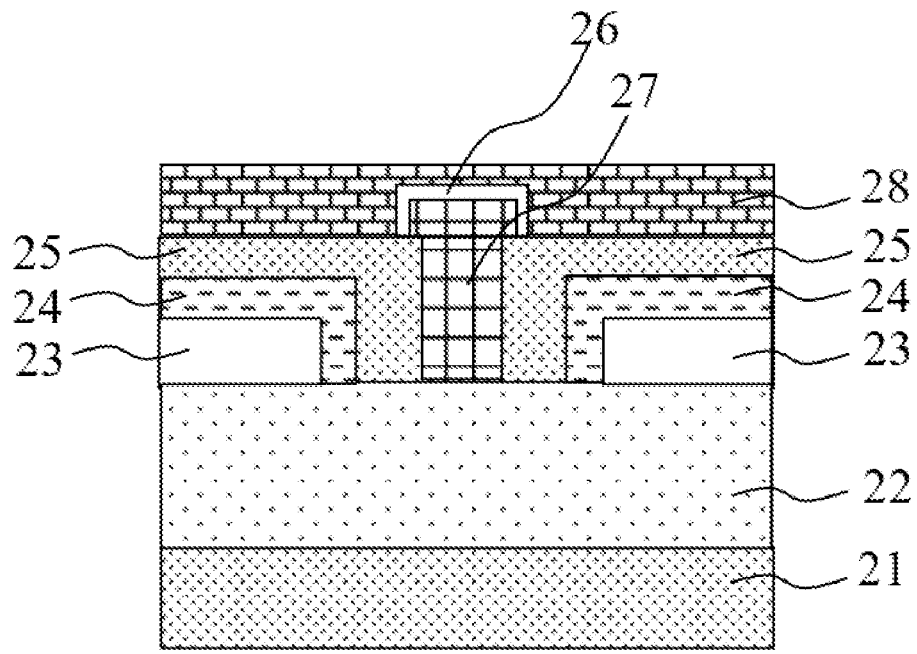
Figure 7F:
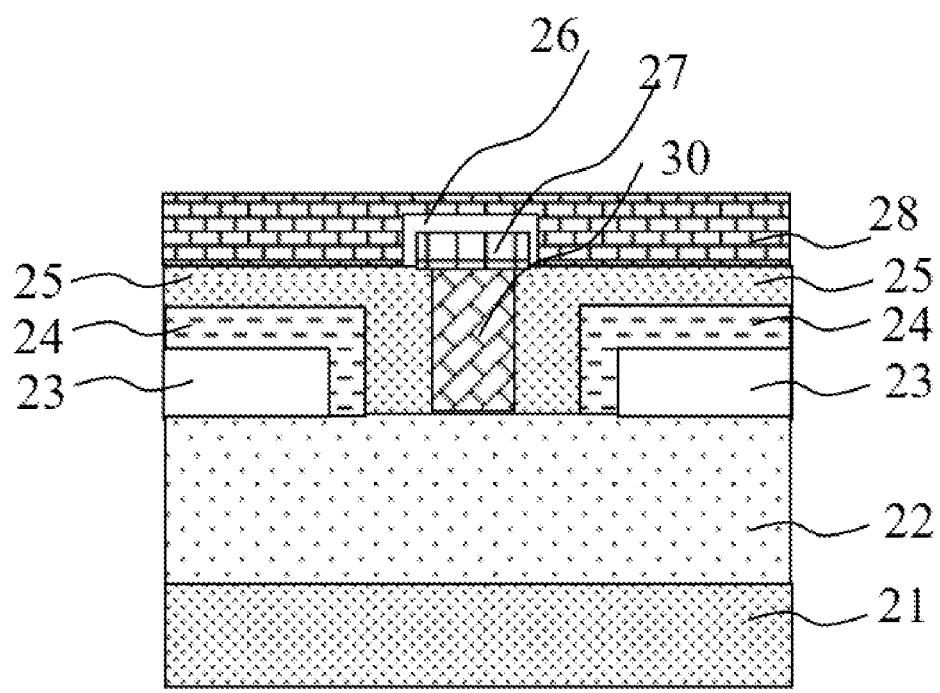
Figure 7G:
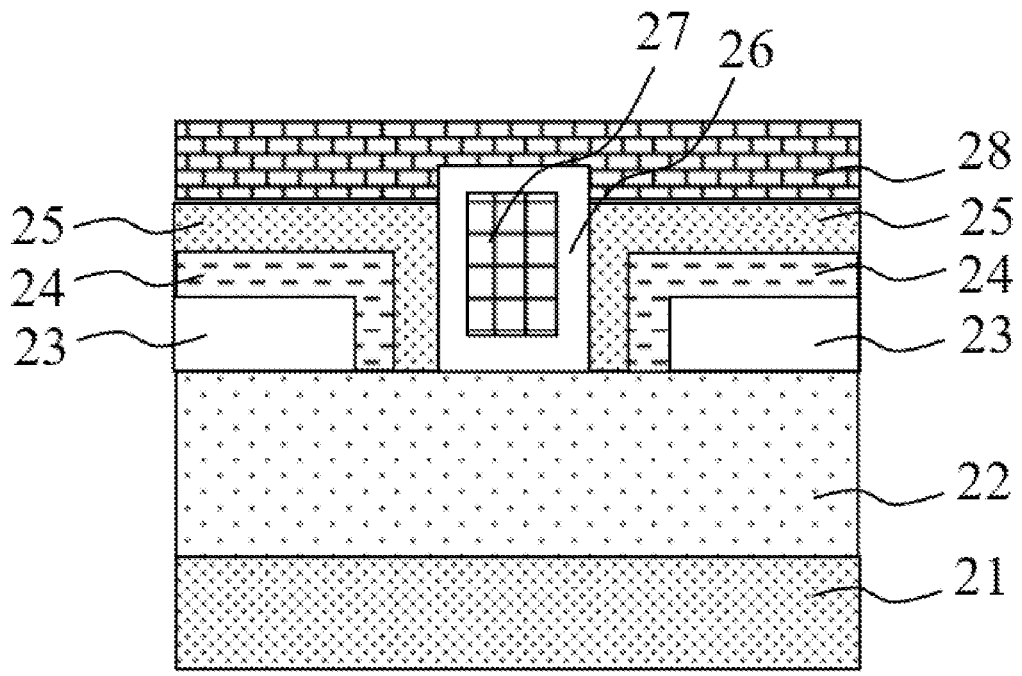
Figure 7H:
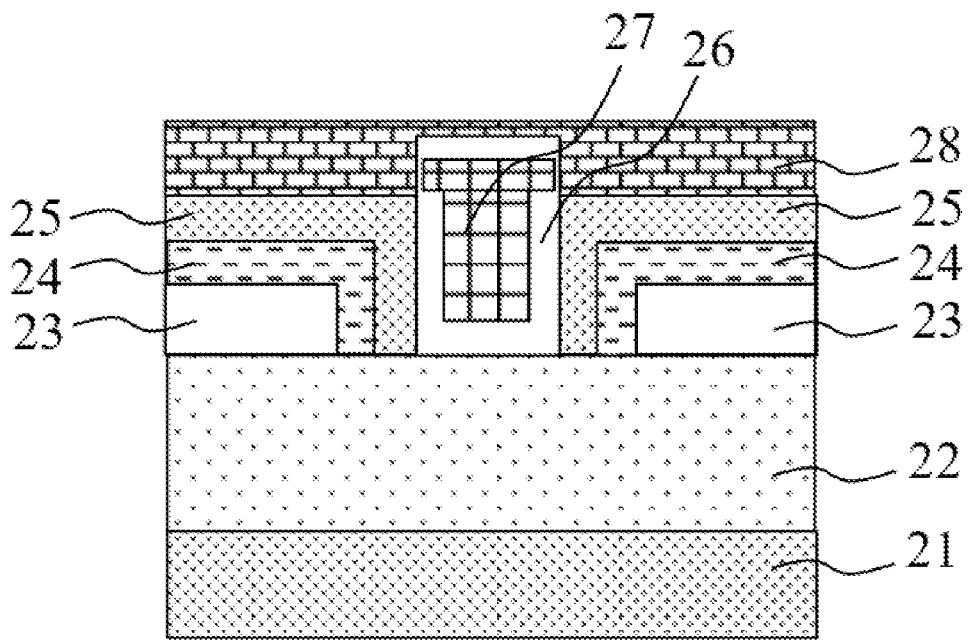

The gate structure includes a gate electrode 27 and a dielectric layer 26, as shown in FIG. 6C. The dielectric layer is disposed between the gate electrode and the nitride barrier layer, and between the gate electrode and the lightly doped n-type nitride layer. The dielectric layer is made up of one or a combination of SiN, SiCN, $SiO_2$, STAIN, $Al_2O_3$, AlON, SiON, $HfO_2$. In another embodiment, a surface of the gate structure is exposed to form a T-shaped structure, as shown in FIG. 6D.

S5, as shown in FIGS. 7A-7H, forming a source electrode 28 on a surface of the nitride barrier layer 25.

The source electrode 28 may be distributed on both sides of the gate structure, and the source electrode is directly formed on the surface of the nitride barrier layer 25. Corresponding to embodiments 6A-6D, the source electrode 28 is arranged as shown in FIGS. 7A-7D.

The source electrode 28 may also be formed on the gate structure and the nitride barrier layer 25, corresponding to the embodiments 6A-6D. The source electrode 28 is arranged as shown in FIGS. 7E-7H to form a buried gate structure. Specifically, the buried gate is formed by firstly recovering the dielectric layer 26 on the gate structure, and then recovering the source electrode 28 on the dielectric layer 26.

S6, as shown in FIGS. 8A-8I, forming a drain electrode 29 contacted with the heavily doped n-type nitride layer 21.

Corresponding to the embodiments 6A-6D, disposing the drain electrode 29 on a back side of the heavily doped n-type nitride layer 21, as shown in FIGS. 8A-8H. The drain electrode 29 is in contact with the heavily doped n-type nitride layer 21 to form an enhancement-mode device with a vertical structure. The back side of the heavily doped n-type nitride layer 21 is the side far away from the lightly doped n-type nitride layer 22. Understandably, when the heavily doped n-type nitride layer 21 is formed on the substrate 10, as shown in the embodiment in FIG. 3B, before forming the drain electrode 29, peeling the substrate 10, and then forming the drain electrode 29 on the back side of the heavily doped n-type nitride layer 21.

Figure 8A:
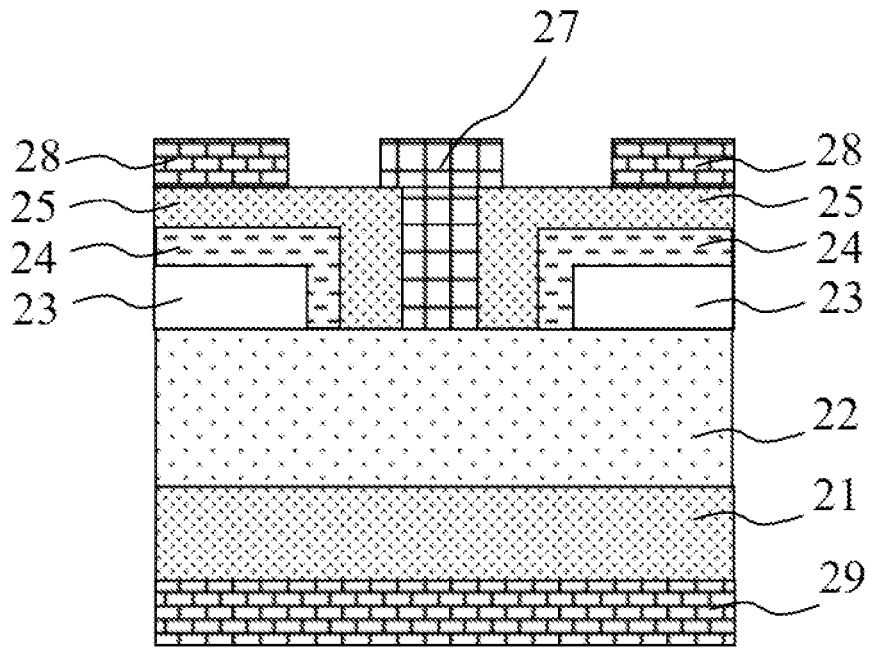
Figure 8B:
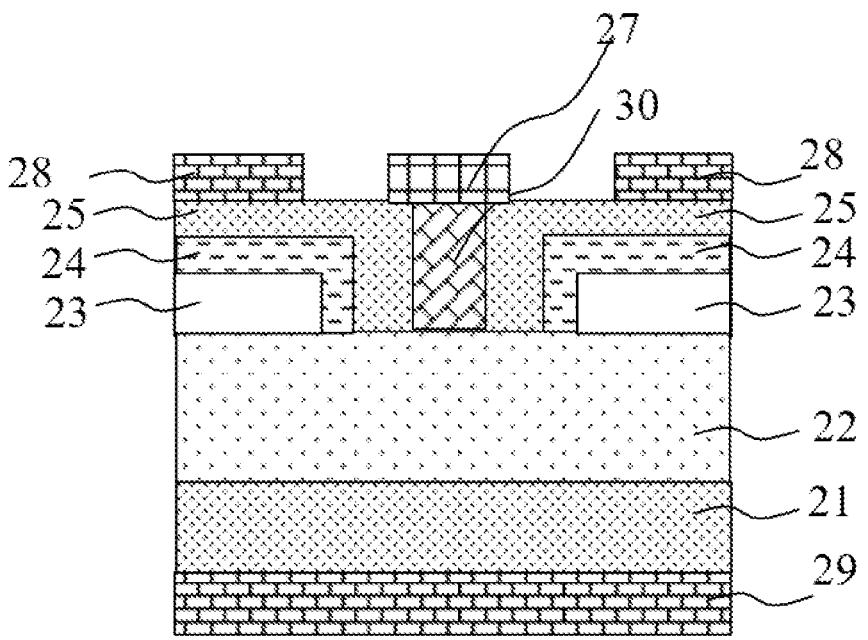
Figure 8C:
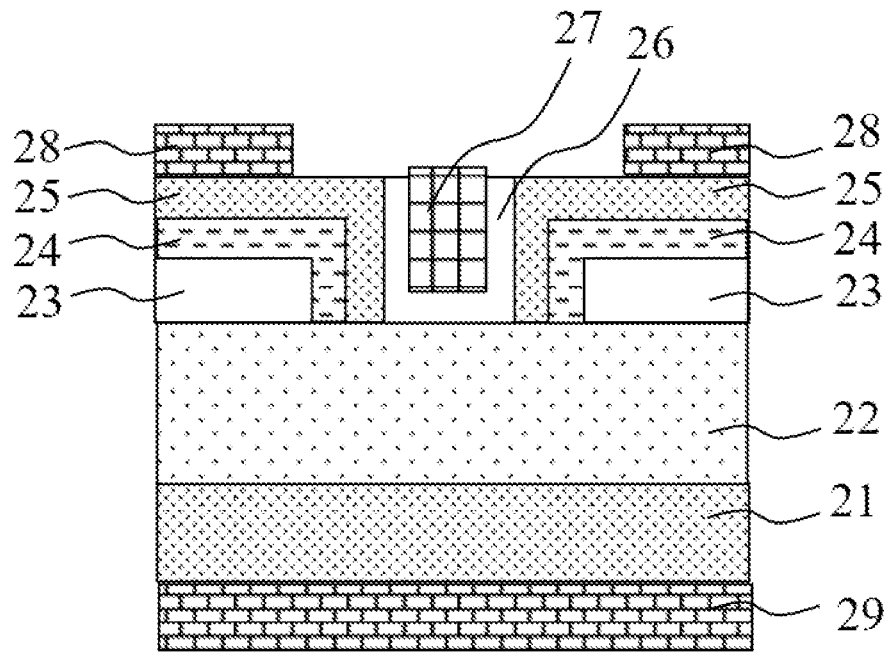
Figure 8D:
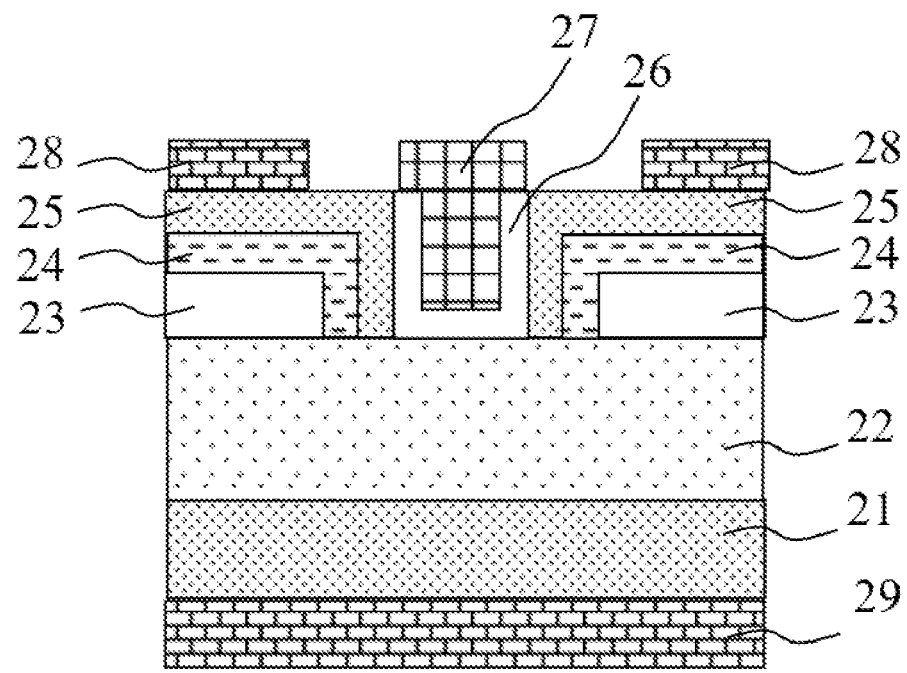
Figure 8E:
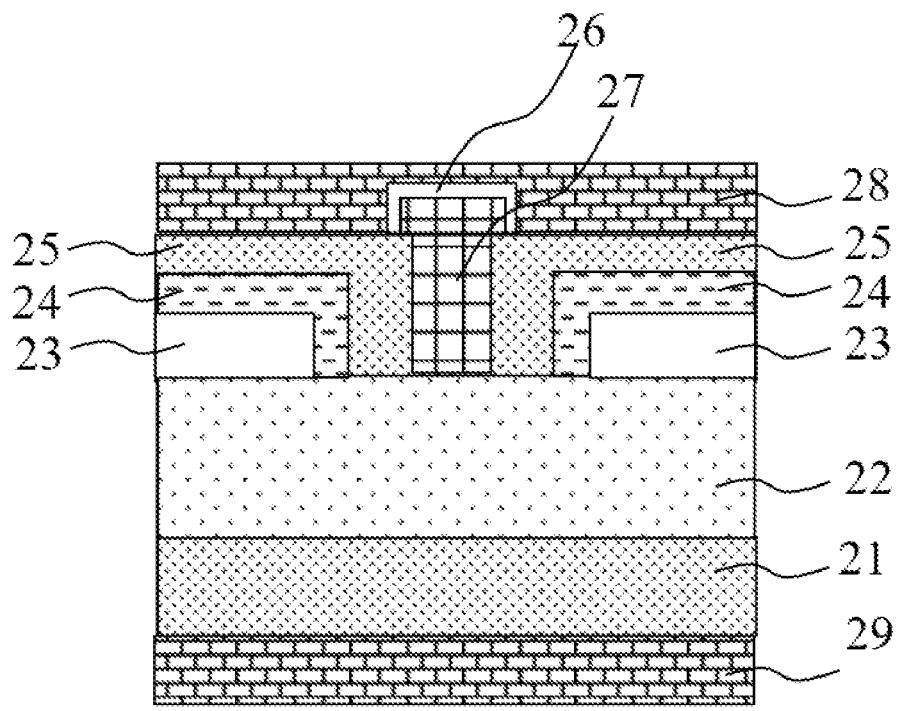
Figure 8F:
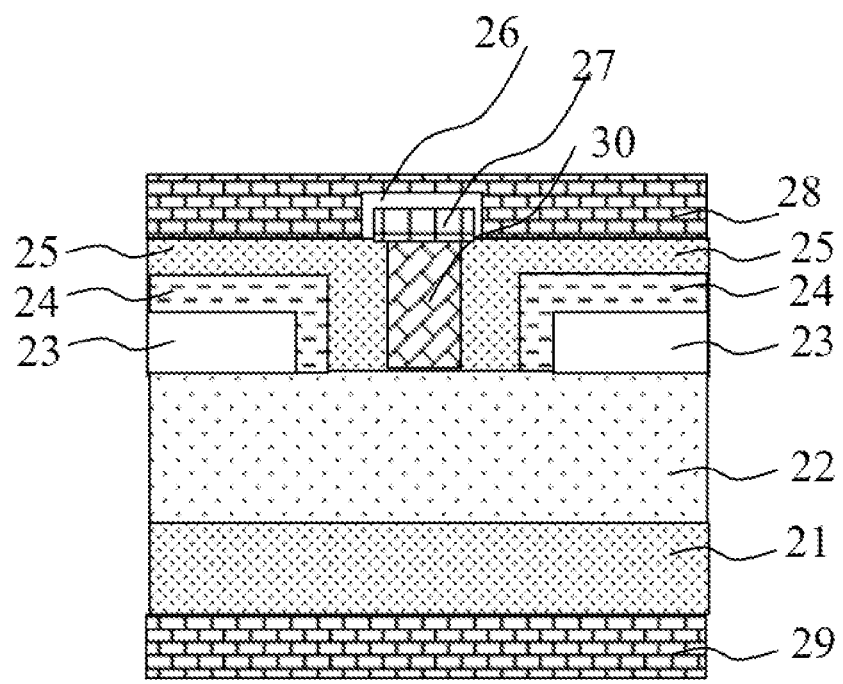
Figure 8G:
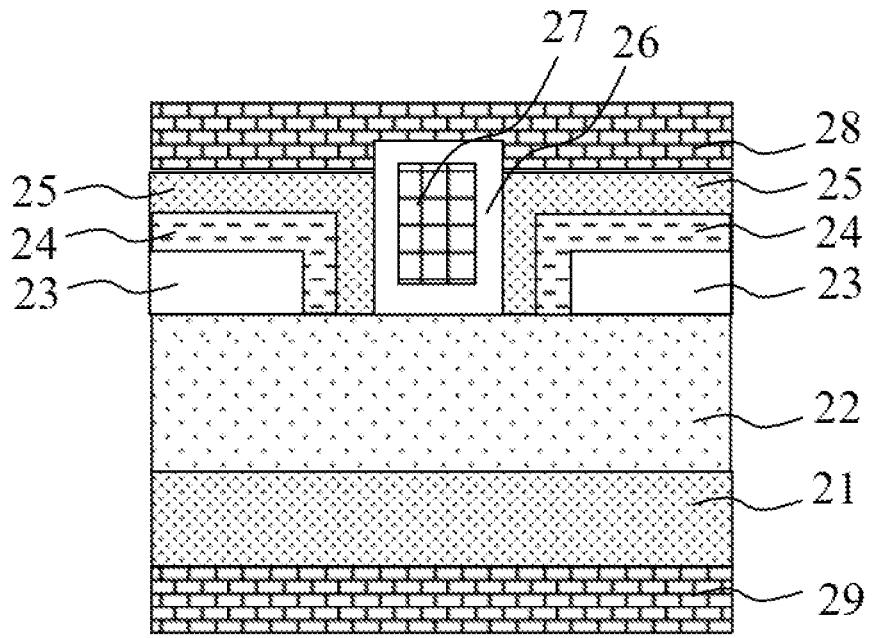
Figure 8H:
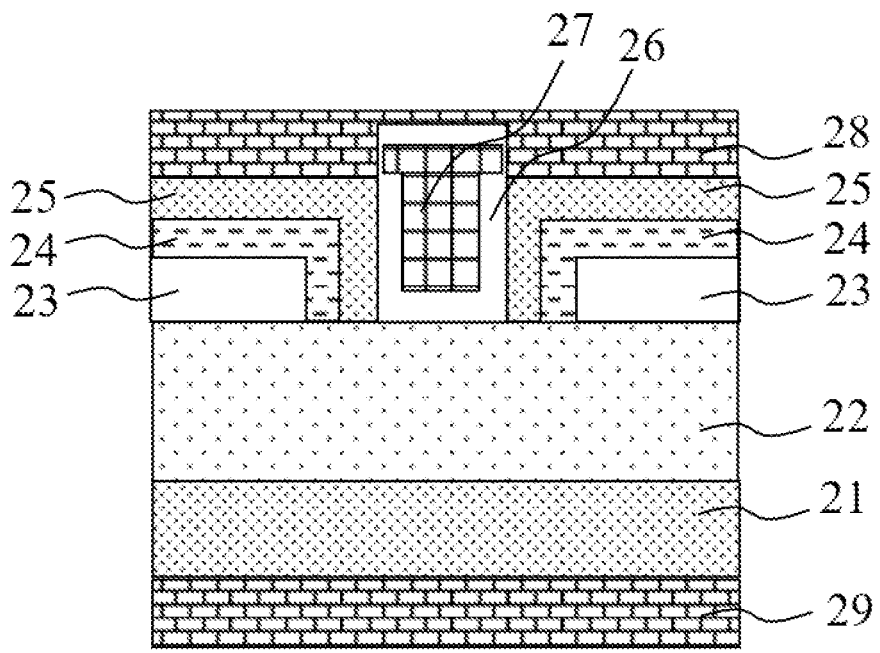
Figure 8I:
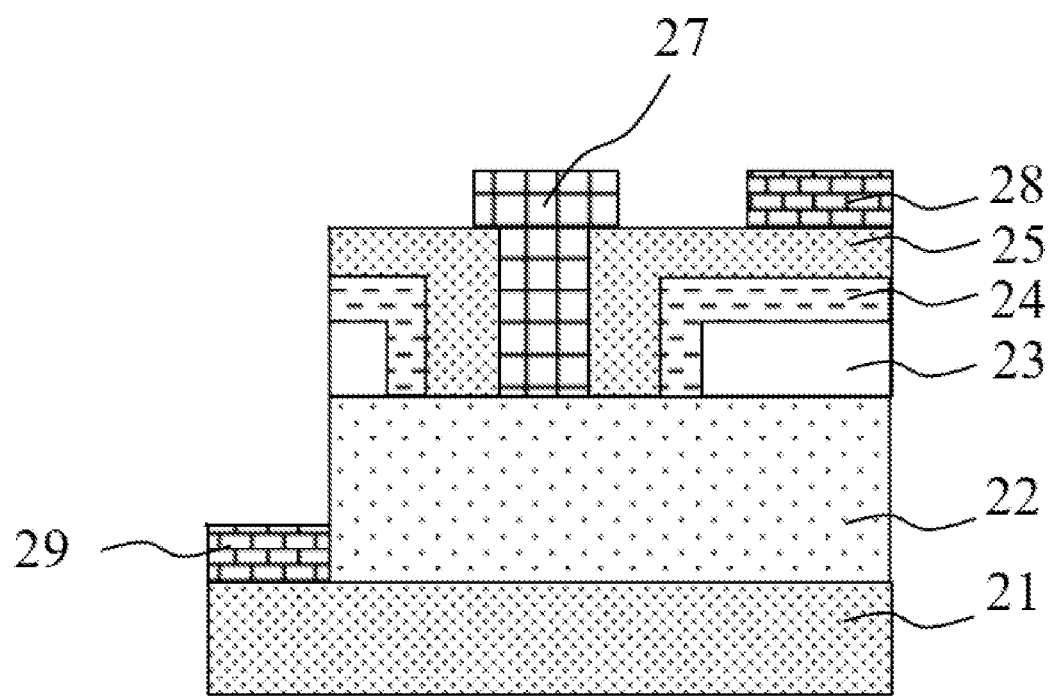

The drain electrode 29 may further be disposed on a front side of the heavily doped n-type nitride layer 21, as shown in FIG. 8I, to form an enhancement-mode device with semi-vertical structure. The front side of the heavily doped n-type nitride layer 21 is the side close to the lightly doped n-type nitride layer 22. Specifically, in a structure shown in FIG. 8I, which is the corresponding embodiment of 6A, after forming the gate structure, forming the source electrode 29 on the nitride barrier layer 25 located on a side of the gate structure, then forming a trend on the other side of the gate structure. The trend is etched from the nitride barrier layer 25 until the heavily doped n-type nitride layer 21 is exposed. A drain electrode 29 is formed on the front surface of the heavily doped n-type nitride layer 21. In other embodiments, the method of forming the drain electrode 29 on the front surface of the heavily doped n-type nitride layer 21 is the same as that of the 6A embodiment and will not be repeated here.

Further, the heavily doped n-type nitride layer, the lightly doped n-type nitride layer, the insulating layer, the nitride channel layer, and the nitride barrier layer are one or a combination of a gallium nitride layer, an indium gallium nitrogen layer, an aluminum-gallium nitrogen layer, an aluminum-indium nitrogen layer and an aluminum-indium gallium nitrogen layer.

In this embodiment, the insulating layer 23 includes a semi-insulating layer, wherein the semi-insulating layer includes one or more of an unintentionally doped nitride layer, a carbon doped nitride layer, an ion doped nitride layer, and a magnesium doped nitride layer. The insulating layer is mainly used to insulate the heterojunction formed by the nitride channel layer and the nitride barrier layer from the lightly doped n-type nitride layer, and only the heterojunction in the gate structure exposes the non-polar or semi-polar plane works as vertical conductive channel. The so-called semi-insulating is a relative concept, which means, in this invention, that the resistivity of the insulating layer is high (for example, the resistivity is greater than $10^4$ Ω·cm).

The present application further provides an enhancement-mode device with a multilayer epitaxial structure, as shown in FIG. 8A, including:
a heavily doped n-type nitride layer 21;
a lightly doped n-type nitride layer 22 disposed on the heavily doped n-type nitride layer 21;
an insulating layer 23 disposed on the lightly doped n-type nitride layer 22, and a trench being provided in the insulating layer 23;
a nitride channel layer 24 disposed on a surface and sidewall of the insulating layer 23;
a nitride barrier layer 25 disposed on a surface and sidewall of the nitride channel layer 24;
a gate structure disposed between sidewalls of the nitride barrier layer 25;
a source electrode 28 disposed on a surface of the nitride barrier layer 25; and
a drain electrode 29 disposed in contact with the heavily doped n-type nitride layer 21.

In this embodiment, the gate structure includes a gate electrode 27.

As a further improvement of the invention, the gate structure includes a p-type semiconductor 30 and a gate electrode 27 formed on the p-type semiconductor 30, as shown in FIG. 8B, the gate region of the p-type semiconductor 30 includes a p-type GaN base material.

As a further improvement of the invention, the gate structure includes a gate electrode 27 and a dielectric layer 26, and the dielectric layer 26 is disposed between the gate electrode 27 and the nitride barrier layer 25, and between the gate electrode 27 and the lightly doped n-type nitride layer 22, as shown in FIG. 8C.

As a further improvement of the invention, a surface of the gate structure is exposed to form a T-shaped structure, as shown in FIG. 8D.

As a further improvement of the invention, wherein the gate structure is covered by a dielectric layer 26 to form a buried gate, as shown in FIGS. 8E-8H, and a surface of the dielectric layer is covered by the source electrode 28.

The enhancement-mode devices shown in 8A-8H all have a vertical structure, wherein the drain electrode is disposed at a back side of the heavily doped n-type nitride layer 21. As a further improvement of the invention, the enhancement-mode device includes a semi-vertical structure, as shown in FIG. 8I, wherein the drain electrode is disposed at a front side of the heavily doped n-type nitride layer 21.

As a further improvement of the invention, wherein the dielectric layer 26 is made up of one or a combination of SiN, SiCN, $SiO_2$, SiAlN, $Al_2O_3$, AlON, SiON, $HfO_2$.

As a further improvement of the invention, wherein the insulating layer 23 includes a semi-insulating layer, and the semi-insulating layer includes one or more of an unintentionally doped nitride layer, a carbon doped nitride layer, an ion doped nitride layer, and a magnesium doped nitride layer.

As a further improvement of the invention, wherein the heavily doped n-type nitride layer 21, the lightly doped n-type nitride layer 22, the insulating layer 23, the nitride channel layer 24, and the nitride barrier layer 25 are one or a combination of a gallium nitride layer, an indium gallium nitrogen layer, an aluminum-gallium nitrogen layer, an aluminum-indium nitrogen layer and an aluminum-indium gallium nitrogen layer.

As a further improvement of the invention, wherein the multilayer epitaxial structure further includes a nitride cap layer formed on the nitride barrier layer 25, and the nitride cap layer is a gallium nitride layer or an aluminum gallium nitride layer.

As a further improvement of the invention, wherein an aluminum nitride layer is disposed between the nitride channel layer 25 and the nitride channel layer 24.

As a further improvement of the invention, wherein a cross-section shape of the trench in the insulating layer is one or a combination of U-shape, V-shape, rectangle, triangle, trapezoid, polygon, and semicircle.

Compared with the prior art of the enhancement-mode device, the advantages based on the above-mentioned technical schemes are:

In present invention, two-dimensional electronic gas is interrupted in a place where a nitride heterojunction is prepared with a non-polar surface or a semi-polar surface, so that an enhancement-mode device is obtained. Compared with the method of etching the nitride barrier layer or implanting the gate region with fluoride ion, the present invention can avoid a performance degradation of the device caused by the damage of a source region, such as the current density reduction effect. Moreover, it is also easier to realize in process.

In this invention, a vertical structure device is achieved through well ohmic contact, formed by a connection between a drain electron located on a back side and a heavily doped n-type nitride layer. A semi-vertical structure device is achieved through well ohmic contact, formed by a connection between the drain electron located on the front side and the heavily doped n-type nitride layer. A lightly doped n-type nitride layer has functions of conducting electricity and withstanding voltage. A heterojunction, composed of a nitride channel layer and a nitride barrier layer, with two-dimensional electron gas, is working as a conductive channel. Part of the conductive channel is interrupted due to non-polarity or semi-polarity. The gate mainly controls this part of the conductive channel to be on or off.

In this invention, an insulating layer is used to insulate the heterojunction from the lightly doped n-type nitride layer. Only the heterojunction with non-polar surface or semi-polar surface, exposed in the gate region, is used as a conductive channel. The insulating layer includes a semi-insulating nitride layer. Preparing a dielectric layer between a gate electrode and a nitride barrier layer and between the gate electrode and the lightly doped n-type nitride layer to reduce gate leakage current. If a surface of the gate is covered by the dielectric layer, a source electrode located in the nitride barrier layer can also cover the gate region, so that the process of patterning the source electrode can be simplified. Forming the source electrode on one side of the gate structure and etching a trench on the other side until the heavily doped n-type nitride layer is exposed, and then forming the drain electrode, so that an enhancement-mode device with semi-vertical structure is realized.

The structural design of the present invention realizes a enhancement-mode device based on nitride material with vertical structure and semi-vertical structure. The device has advantages of smaller on-resistance, higher current holding capacity and higher chip area utilization rate.

It is intelligible to those skilled in the art that, the present invention is not limited to the details of the embodiments described above. The present invention can be implemented in other concrete forms without deviating the spirit or basic features of the present invention. Therefore, from any point of view, the embodiments should be regarded as exemplary and non-restrictive. The scope of the present invention is defined by the appended claims rather than the above description; therefore, it is intended to include in the present invention all variations which fall within the meaning and scope of the equivalent requirements of the claim. Any reference signs in the claims do not limit their scope.

In addition, it should be understood that although this specification is described in accordance with the embodiments, every single embodiment not just includes an independent technical solution. This representation of the specification is for clarity only, and the technical personnel in the field shall take the specification as a whole. The technical solutions in the embodiments may be suitably combined to form other embodiments that can be understood by the technical personnel in the field.

What is claimed is:

1. An enhancement-mode device with a multilayer epitaxial structure, comprising:
    a heavily doped n-type nitride layer;
    a lightly doped n-type nitride layer disposed on the heavily doped n-type nitride layer;
    an insulating layer disposed on the lightly doped n-type nitride layer, and a trench being provided in the insulating layer;
    a nitride channel layer disposed on a surface and a sidewall of the insulating layer;
    a nitride barrier layer disposed on a surface and a sidewall of the nitride channel layer;
    a gate structure disposed between sidewalls of the nitride barrier layer;
    a source electrode disposed on a surface of the nitride barrier layer; and
    a drain electrode disposed in contact with the heavily doped n-type nitride layer,
    wherein a bottom of the trench is not covered by the nitride channel layer and by the nitride barrier layer,
    wherein the nitride channel layer and the nitride barrier layer form a heterojunction with a two-dimensional electron gas, and the insulating layer is located at a side, away from the gate structure, of the heterojunction.

2. The enhancement-mode device of claim 1, wherein the gate structure comprises a p-type semiconductor and a gate electrode formed on the p-type semiconductor.

3. The enhancement-mode device of claim 1, wherein the gate structure comprises a gate electrode and a dielectric layer, and the dielectric layer is disposed between the gate electrode and the nitride barrier layer, and between the gate electrode and the lightly doped n-type nitride layer.

4. The enhancement-mode device of claim 1, wherein the gate structure exceeds the sidewall of the nitride barrier layer and extends to an upper surface of the nitride barrier layer to form a T-shaped structure.

5. The enhancement-mode device of claim 1, wherein the gate structure is covered by a dielectric layer and a surface of the dielectric layer is covered by the source electrode, so as to form a buried gate electrode.

6. The enhancement-mode device of claim 1, wherein the drain electrode is disposed at a back side of the heavily doped n-type nitride layer.

7. The enhancement-mode device of claim 1, wherein the drain electrode is disposed at a front side of the heavily doped n-type nitride layer.

8. The enhancement-mode device of claim 1, wherein the insulating layer comprises a semi-insulating layer.

9. The enhancement-mode device of claim 1, wherein the multilayer epitaxial structure further comprises a nitride cap layer formed on the nitride barrier layer, and the nitride cap layer is a gallium nitride layer or an aluminum gallium nitride layer.

10. The enhancement-mode device of claim 1, wherein an aluminum nitride layer is disposed between the nitride barrier layer and the nitride channel layer.

11. The enhancement-mode device of claim 1, wherein a cross-section shape of the trench in the insulating layer is one or a combination of U-shape, V-shape, rectangle, triangle, trapezoid, polygon, and semicircle.

12. A method of preparing an enhancement-mode device, comprising:

S1, forming a lightly doped n-type nitride layer on a heavily doped n-type nitride layer;

S2, forming an insulating layer on the lightly doped n-type nitride layer, and a trench being provided in the insulating layer;

S3, forming a nitride channel layer on a surface and sidewalls of the insulating layer, and forming a nitride barrier layer on a surface and sidewalls of the nitride channel layer, wherein the nitride channel layer and the nitride barrier layer have a non-polar surface or a semi-polar surface, and at least part of the two-dimensional electron gas is interrupted;

S4, forming a gate structure between sidewalls of the nitride barrier layer;

S5, forming a source electrode on a surface of the nitride barrier layer; and

S6, forming a drain electrode contacted with the heavily doped n-type nitride layer, wherein a bottom of the trench is not covered by the nitride channel layer and by the nitride barrier layer, wherein the nitride channel layer and the nitride barrier layer form a heterojunction with a two-dimensional electron gas, and the insulating layer is located at a side, away from the gate structure, of the heterojunction.

13. The method of claim 12, wherein the gate structure comprises a p-type semiconductor and a gate electrode formed on the p-type semiconductor.

14. The method of claim 12, wherein the gate structure comprises a gate electrode and a dielectric layer, and the dielectric layer is disposed between the gate electrode and the nitride barrier layer, and between the gate electrode and the lightly doped n-type nitride layer.

15. The method of claim 12, before the step S1, the method further comprising: providing a substrate, and growing the heavily doped n-type nitride layer on the substrate; and before the step S6, the method further comprising: etching or peeling the substrate until the heavily doped n-type nitride layer is exposed; forming a drain electrode on a back of the heavily doped n-type nitride layer.

16. The method of claim 12, before the step S6, the method further comprising:

etching the nitride barrier layer from a side of the nitride barrier layer away from the heavily doped n-type nitride layer until the heavily doped n-type nitride layer is exposed, and forming a drain electrode on a front surface of the heavily doped n-type nitride layer.

17. The method of claim 12, wherein the insulating layer comprises a semi-insulating layer.

18. The method of claim 17, wherein the semi-insulating layer comprises one or more of an unintentionally doped nitride layer, a carbon doped nitride layer, an ion doped nitride layer, and a magnesium doped nitride layer.

19. The method of claim 12, wherein the step S4 further comprises:

forming an aluminum nitride layer between the nitride barrier layer and the nitride channel layer.

20. The enhancement-mode device of claim 3, wherein the dielectric layer is made up of one or more of SiN, SiCN, $SiO_2$, SiAlN, $Al_2O_3$, AlON, SiON, and $HfO_2$.

* * * * *